United States Patent
Madasu

(10) Patent No.: US 11,639,657 B2
(45) Date of Patent: May 2, 2023

(54) CONTROLLING WELLBORE EQUIPMENT USING A HYBRID DEEP GENERATIVE PHYSICS NEURAL NETWORK

(71) Applicant: Landmark Graphics Corporation, Houston, TX (US)

(72) Inventor: Srinath Madasu, Houston, TX (US)

(73) Assignee: Landmark Graphics Corporation, Houston, TX (US)

(*) Notice: Subject to any disclaimer, the term of this patent is extended or adjusted under 35 U.S.C. 154(b) by 272 days.

(21) Appl. No.: 16/899,946

(22) Filed: Jun. 12, 2020

(65) Prior Publication Data

US 2021/0388710 A1 Dec. 16, 2021

(51) Int. Cl.
*G06F 17/00* (2019.01)
*G01V 99/00* (2009.01)
(Continued)

(52) U.S. Cl.
CPC .............. *E21B 44/00* (2013.01); *E21B 47/07* (2020.05); *G05B 13/027* (2013.01);
(Continued)

(58) Field of Classification Search
CPC . E21B 44/00; E21B 47/07; E21B 7/04; E21B 2200/20; E21B 2200/22;
(Continued)

(56) References Cited

U.S. PATENT DOCUMENTS 6,577,700 B1    6/2003  Fan et al.
9,598,947 B2 *  3/2017  Wang ...................... E21B 44/00
(Continued)

FOREIGN PATENT DOCUMENTS

KR    102155101    *  9/2020
WO    2019055565       3/2019
(Continued)

OTHER PUBLICATIONS

GB Application No. GB2106193.2 , "Combined Search and Examination Report", dated Jan. 5, 2022, 9 pages.
(Continued)

*Primary Examiner* — Nghia M Doan
(74) *Attorney, Agent, or Firm* — Kilpatrick Townsend & Stockton LLP

(57) ABSTRACT

A system includes equipment for at least one of formation of, stimulation of, or production from a wellbore, a processor, and a non-transitory memory device. The processor is communicatively coupled to the equipment. The non-transitory memory device contains instructions executable by the processor to cause the processor to perform operations comprising training a hybrid deep generative physics neural network (HDGPNN), iteratively computing a plurality of projected values for wellbore variables using the HDGPNN, comparing the projected values to measured values, adjusting the projected values using the HDGPNN until the projected values match the measured values within a convergence criteria to produce an output value for at least one controllable parameter, and controlling the equipment by applying the output value for the at least one controllable parameter.

20 Claims, 11 Drawing Sheets

(51) Int. Cl.
*G06N 3/08* (2006.01)
*E21B 44/00* (2006.01)
*G06F 30/27* (2020.01)
*E21B 47/07* (2012.01)
*G05B 13/02* (2006.01)
*G05B 13/04* (2006.01)
*G06N 3/04* (2023.01)

(52) U.S. Cl.
CPC ........... *G05B 13/042* (2013.01); *G06F 30/27* (2020.01); *G06N 3/0454* (2013.01); *G06N 3/08* (2013.01)

(58) Field of Classification Search
CPC ..... E21B 47/06; G05B 13/027; G05B 13/042; G06F 30/27; G06F 17/00; G06N 3/0454; G06N 3/08; G01V 99/005
See application file for complete search history.

(56) References Cited

U.S. PATENT DOCUMENTS

| | | | |
|---|---|---|---|
| 2016/0326846 | A1 | 11/2016 | Rashid et al. |
| 2019/0345809 | A1 | 11/2019 | Jain et al. |
| 2020/0065677 | A1* | 2/2020 | Iriarte Lopez ........... G06N 3/04 |
| 2020/0132882 | A1 | 4/2020 | Runkana et al. |
| 2020/0183041 | A1 | 6/2020 | Denli et al. |
| 2021/0062634 | A1* | 3/2021 | Madasu ................... G06N 3/08 |

FOREIGN PATENT DOCUMENTS

| | | |
|---|---|---|
| WO | 2020005238 | 1/2020 |
| WO | 2020027861 | 2/2020 |
| WO | 2020040829 | 2/2020 |
| WO | 2020046350 | 3/2020 |

OTHER PUBLICATIONS

Madasu et al., "A Hybrid Deep Physics Neural Network Model for Unsupervised Autoencoder to Perform Data Conditioning", 2019 IEEE International Symposium on Signal Processing and Information Technology (ISSPIT). IEEE, Dec. 2019, pp. 1-7.
Application No. PCT/US2020/037428, International Search Report and Written Opinion, dated Mar. 2, 2021, 9 pages.
Pang et al., "FPINNs: Fractional Physics-Informed Neural Networks", SIAM Journal on Scientific Computing, Jan. 2019, 25 pages.
Raissi et al., "Hidden Physics Models: Machine Learning of Nonlinear Partial Differential Equations", Division of Applied Mathematics, Brown University, Aug. 2017, 17 pages.
Raissi et al., "Physics Informed Deep Learning Part I: Data-Driven Solutions of Nonlinear Partial Differential Equations", Division of Applied Mathematics, Brown University, Nov. 28, 2017, 22 pages.
Raissi et al., "Physics Informed Deep Learning Part II: Data-Driven Discovery of Nonlinear Partial Differential Equations", Division of Applied Mathematics, Brown University, Nov. 28, 2017, 19 pages.

* cited by examiner

CONTROLLING WELLBORE EQUIPMENT USING A HYBRID DEEP GENERATIVE PHYSICS NEURAL NETWORK

TECHNICAL FIELD

The present disclosure relates generally to wellbore systems. More specifically, but not by way of limitation, this disclosure relates to controlling equipment used for wellbore formation, stimulation, or production.

BACKGROUND

A hydrocarbon well includes a wellbore drilled through a subterranean formation. The subterranean formation can include a rock matrix permeated by the oil or gas that is to be extracted. The oil or gas distributed through the rock matrix can be referred to as a "reservoir." Reservoirs are often modeled with statistical techniques in order to make predictions or determine control values that can be used in drilling, stimulation, or production to maximize the yield of oil or gas from the subterranean formation.

DETAILED DESCRIPTION

Figure 1:
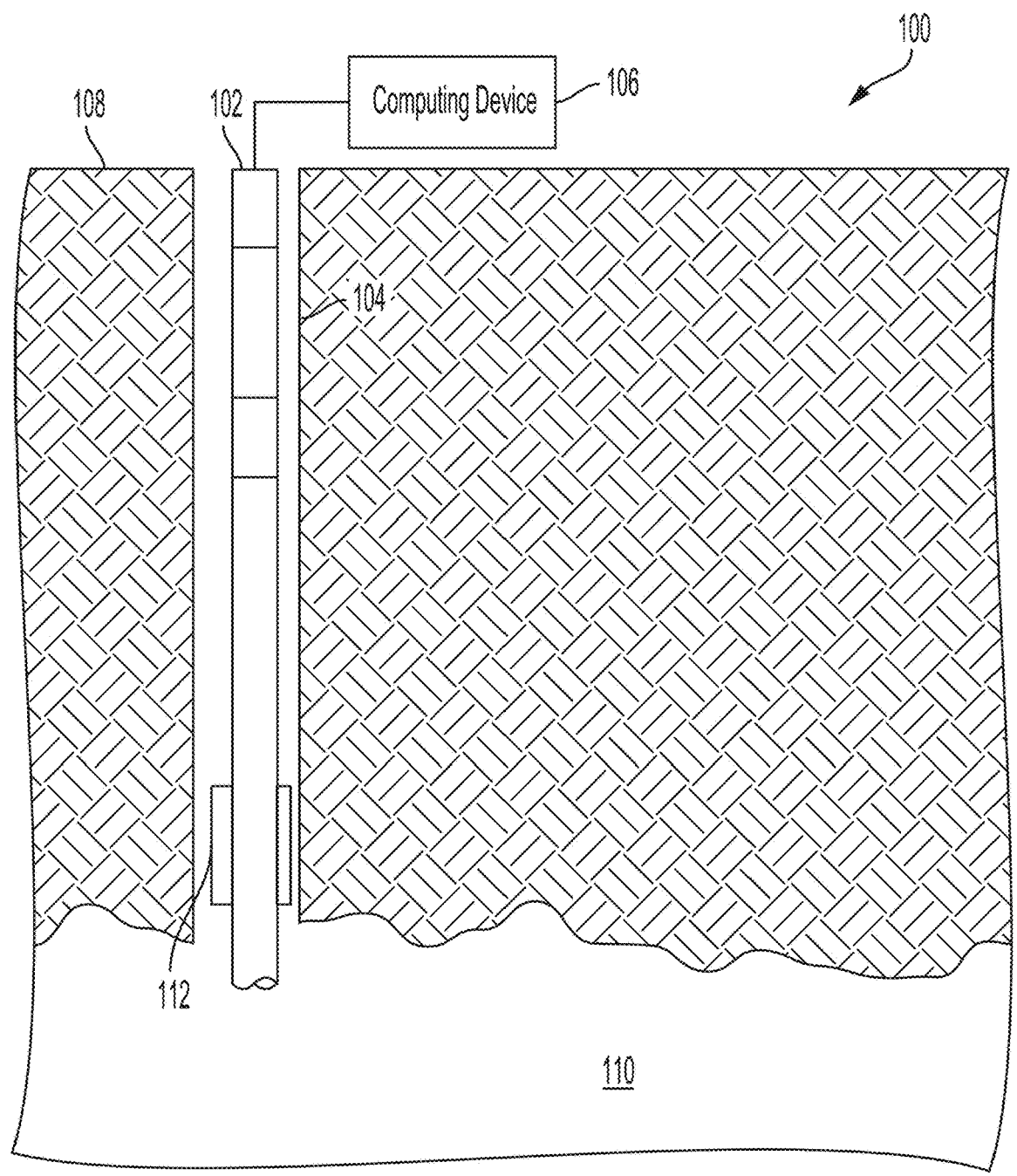
FIG. 1 is a cross-sectional view of a wellbore system in which equipment is controlled using a hybrid deep generative physics neural network according to some aspects of the disclosure.

Certain aspects and features of the present disclosure relate to controlling wellbore equipment in a hydrocarbon well using an output provided by a system of concurrent, trained neural networks. The trained neural networks may include a hybrid neural network, herein referred to as a hybrid deep generative physics neural network (HDGPNN). The trained HDGPNN may use a set of outputs from a second, concurrent, trained neural network from the trained neural networks, as well as measured data from a wellbore, to output a set of projections related to a wellbore. The projections may include controllable parameters to cause formation of, stimulation of, or production from the wellbore, or a combination thereof. Formation of the wellbore can include drilling the wellbore. Stimulation of the wellbore can include fracturing of or gas injection into the wellbore. Production from the wellbore can include pumping produced hydrocarbon material out of the wellbore.

The HDGPNN can be trained with a combination of measured data from the wellbore and the outputs of the second, concurrent, trained neural network. The measured data from the wellbore or a reservoir can include pressure, porosity, microseismic values, permeability, fracture geometry values, fracture length values, a combination thereof, or any other measured data relevant to formation of, stimulation of, or production from the wellbore. The second, concurrent, trained neural network, herein referred to as a deep generative physics neural network (DGPNN), can output projections of parameters related to the wellbore or the reservoir such as pressure, porosity, microseismic values, permeability, fracture geometry values, fracture length values, a combination thereof, or any other parameters relevant to formation of, stimulation of, or production from the wellbore.

Aspects and features of the system can include the use of the HDGPNN in a sequential way to assimilate newly available data. This neural network approach can solve highly nonlinear equations that are otherwise difficult or impossible to solve analytically. The system can therefore solve difficult problems more quickly than would be otherwise possible. As an example, the system can solve flow simulation problems.

The DGPNN can be trained with a combination of input data related to the reservoir and a physics-based model. Input data from the reservoir can include pressure, temperature, permeability, porosity, a combination thereof, or any other data relevant to cause formation of, stimulation of, or production from the wellbore. The physics-based model can be any physics model relevant to wellbore operations. In some examples, the physics-based model can model the reservoir. For example, the physics-based model can model diffusion in the reservoir.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1 is a cross-sectional view of an example of a wellbore system 100 that is subject to data gathering and the subsequent use of a data-driven physics-based model to manage equipment 102 associated with a wellbore 104. Non-limiting examples of the equipment 102 include one or more drilling tools, fracturing equipment, and pumps, valves or other equipment related to production from the wellbore 104. The wellbore system 100 includes a computing device 106 disposed at the surface 108 of a subterranean formation, as well as the equipment 102. The equipment 102 can be disposed in the wellbore 104 and can also be disposed in a reservoir 110. It should be noted that while the wellbore 104 is shown as a vertical wellbore, the wellbore 104 can additionally or alternatively have a substantially horizontal section in which equipment is located. A sensor 112 can be communicatively coupled to the equipment 102 disposed in the wellbore 104 and the reservoir 110, and the sensor 112 can also be communicatively coupled to the computing device 106.

The computing device 106 can receive data from the sensor 112. The data from the sensor 112 can be received from the equipment 102 disposed in the wellbore 104 and the reservoir 110. The data can include characteristics of the reservoir 110 such as viscosity, velocity and fluid pressure as these quantities spatially vary. The data associated with the reservoir 110 can be used to train a neural network in computing device 106. In the example of FIG. 1, data from the wellbore 104 can be used to train a neural network to control the equipment 102 in the wellbore 104. While the wellbore 104 is being illustrated as operating in isolation with data considered "real-time" since the data is typically collected as some kind of wellbore equipment is being operated, in another example, it is possible to acquire a dataset from a second wellbore (not pictured in FIG. 1) and to use the dataset to train the neural network to control equipment in the wellbore 104. It is also possible to train the neural network with data gathered from the wellbore 104 and use the neural network to control the equipment 102 in the wellbore 104 at later times.

Figure 2:
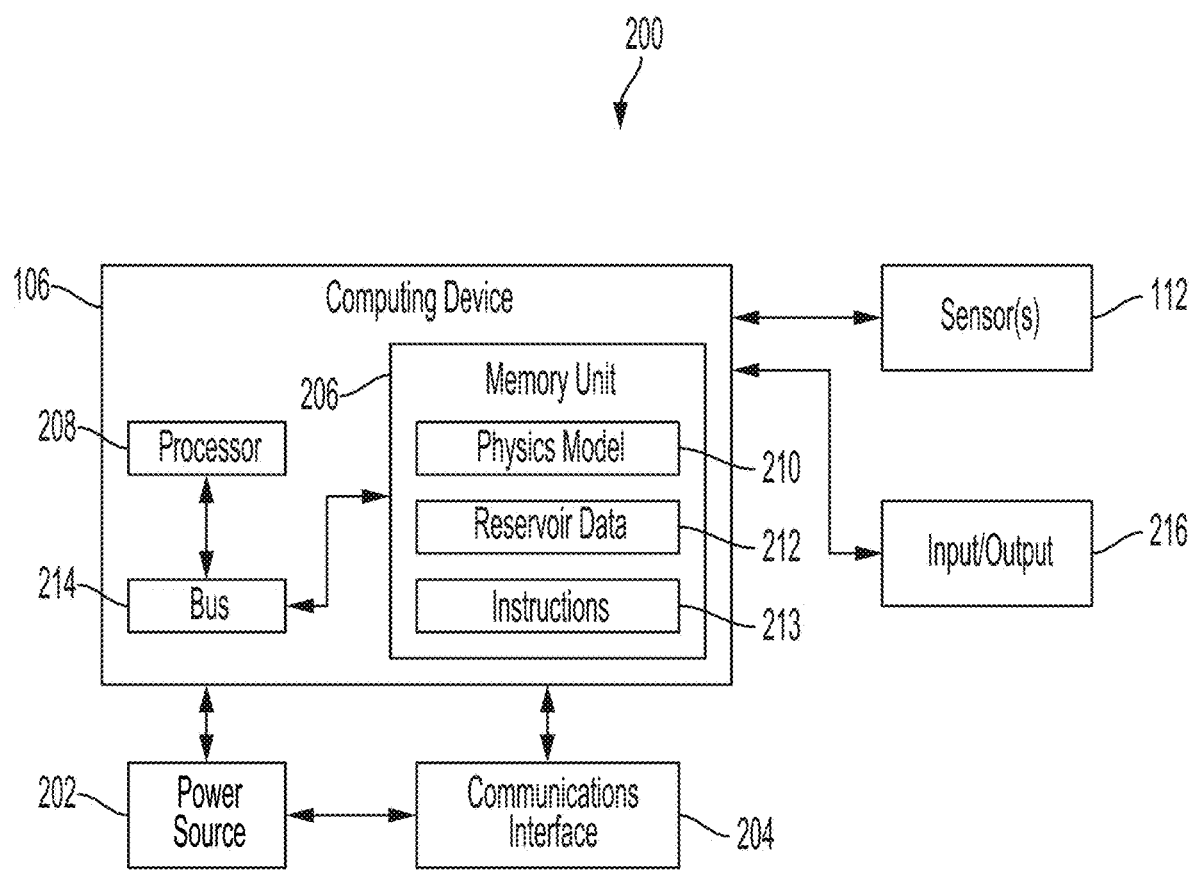
FIG. 2 is a block diagram of a computing device for controlling wellbore equipment using a hybrid deep generative physics neural network according to some aspects of the disclosure.

FIG. 2 is a block diagram 200 of an example of a computing device 106 that can control wellbore equipment using a hybrid deep generative physics neural network according to some aspects of the disclosure. The computing device 106 can be coupled to a power source 202, and a communications interface 204 can be communicatively coupled to both the computing device and the power source 202. A sensor 112 can be communicatively coupled to the computing device 106, and the sensor 112 can also be communicatively coupled to wellbore equipment (not pictured in FIG. 2). The sensor 112 can generate data from wellbore equipment and transmit data to the computing device 106.

The computing device 106 can include a memory unit 206. The memory unit 206 can include one memory device or multiple memory devices. The memory unit 206 can be non-volatile and may include any type of memory device that retains stored information when powered off. Non-limiting examples of the memory unit 206 include electrically erasable and programmable read-only memory, flash memory, or any other type of non-volatile memory. At least some of the memory unit 206 can include a non-transitory computer-readable medium from which a processing device 208 can read instructions. The non-transitory computer-readable medium can include electronic, optical, magnetic, or other storage devices capable of providing the processor 208 with the instructions or other program code. Non-limiting examples of the non-transitory computer-readable medium include magnetic disk(s), memory chip(s), read-only memory, random-access memory, an application-specific integrated circuit, a configured processor, optical storage, or any other medium from which a computer processor can read the instructions. In some examples, the instructions can include processor-specific instructions generated by a compiler or an interpreter from code written in any suitable computer-programming language, such as C, C++, C#, or Java.

The memory unit 206 can include a physics model 210 and a set of reservoir data 212. The physics model 210 can be used to generate data, and the physics model 210 can include a cost function based on a first-principles physics model which can include boundary conditions. The reservoir data 212 can be a dataset that includes information transmitted to the computing system 106 from the sensor 112.

The computing system 106 can also include the processing device 208, which can be communicatively coupled to the memory unit 206 by the bus 214. The processing unit 208 can include one or more processors. Non-limiting examples of the processors include a field-programmable gate array, an application-specific integrated circuit, a microprocessor, or any combination of these. The processing unit 208 can execute instructions 213 contained in the memory unit 206 to cause the computing system to control the wellbore equipment. The bus 214 may transfer data to other components of the computing system 106. The bus 214 can include instrumentality for a communication network. The bus 214 can include an address bus, a data bus, and a control bus, each independently configured.

Figure 3:
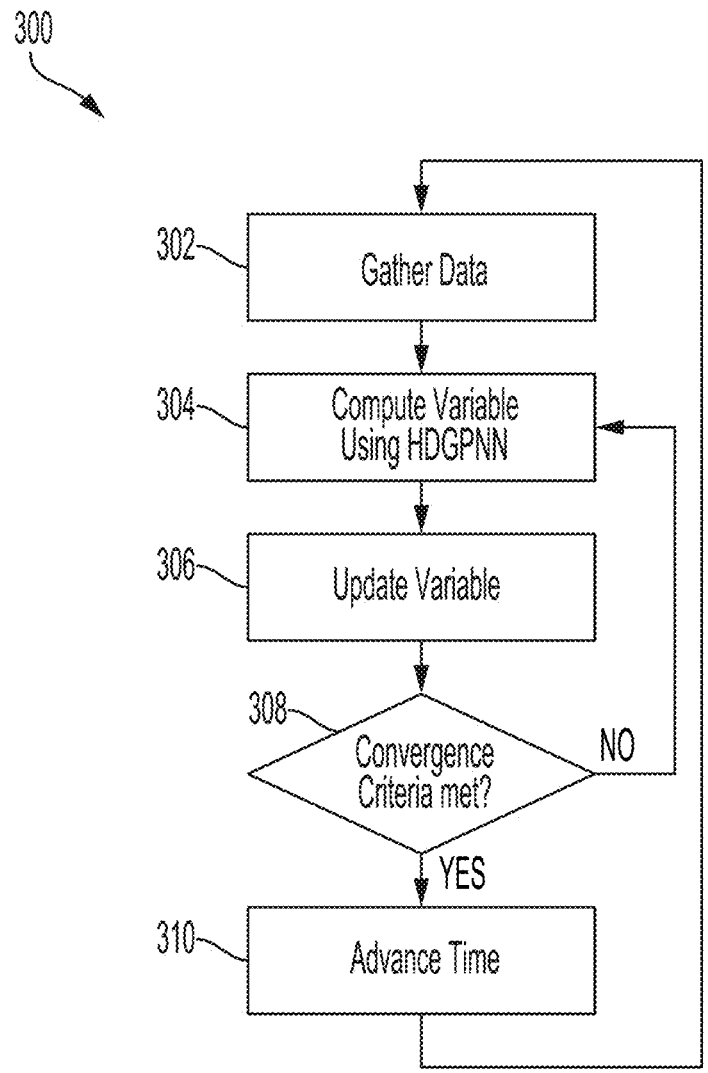
FIG. 3 is a flowchart of a process for controlling wellbore equipment using a hybrid deep generative physics neural network according to some aspects of the disclosure.

FIG. 3 is an example of a flowchart of a process 300 for controlling equipment in a wellbore. At block 302, the processor 208 gathers data to input into the HDGPNN. The data, herein referred to as the input data, can include actual measurements from the wellbore 104 or reservoir 110 with non-limiting examples of measurements including pressure, temperature, permeability, porosity, or a combination thereof. The input data can also include a set of projections from the DGPNN. The projections from the DGPNN can be derived from physics-based models like a diffusion model, and the projections of the DGPNN can include values such as pressure, or temperature, of the wellbore 104 or of the reservoir 110.

At block 304 the processor 208 computes at least one variable using the HDGPNN. With the input data, the HDGPNN can compute the variable or parameter value that may be desirable for controlling the equipment 102 to cause formation of, stimulation of, or production from the wellbore 104. Non-limiting examples of the variables include weight-on-bit and revolutions per minute (RPM) of a set of drilling equipment, or permeability, or porosity, of the reservoir 110. At block 306, the processor 208 updates the variable or parameter value. The value can be computed in block 304.

At block 308, the process 300 compares the variable or parameter value to convergence criteria. The convergence criteria can be a range of acceptable values of the variable or parameter and can be determined from a set of actual measurements. Non-limiting examples of the actual measurements include a rate of penetration of drilling equipment or an amount of produced hydrocarbon pumped from the wellbore 104. If the value does not satisfy the convergence criteria, process 300 can repeat from block 304 and the processor 208 can compute a different value. If the value does satisfy the convergence criteria, the parameter or variable can be used to control the equipment 102 to cause formation of, stimulation of, or production from the wellbore 104. For example, the parameter can include one or more of weight-on-bit, rate of penetration, or revolutions per minute of a drill bit, and can be applied to a drilling tool based on location or orientation of the drilling tool At block 310 the system advances the HDGPNN in time. Blocks 302, 304, 306, and 308 of process 300 can represent a single operation, but the process 300 can also be an iterative process that can execute many computations that can provide many controllable parameters to cause formation of, stimulation of, and production from the wellbore 104. In the latter case, the system uses the HDGPNN to assimilate newly available measured data into the system sequentially, over time.

Figure 4:
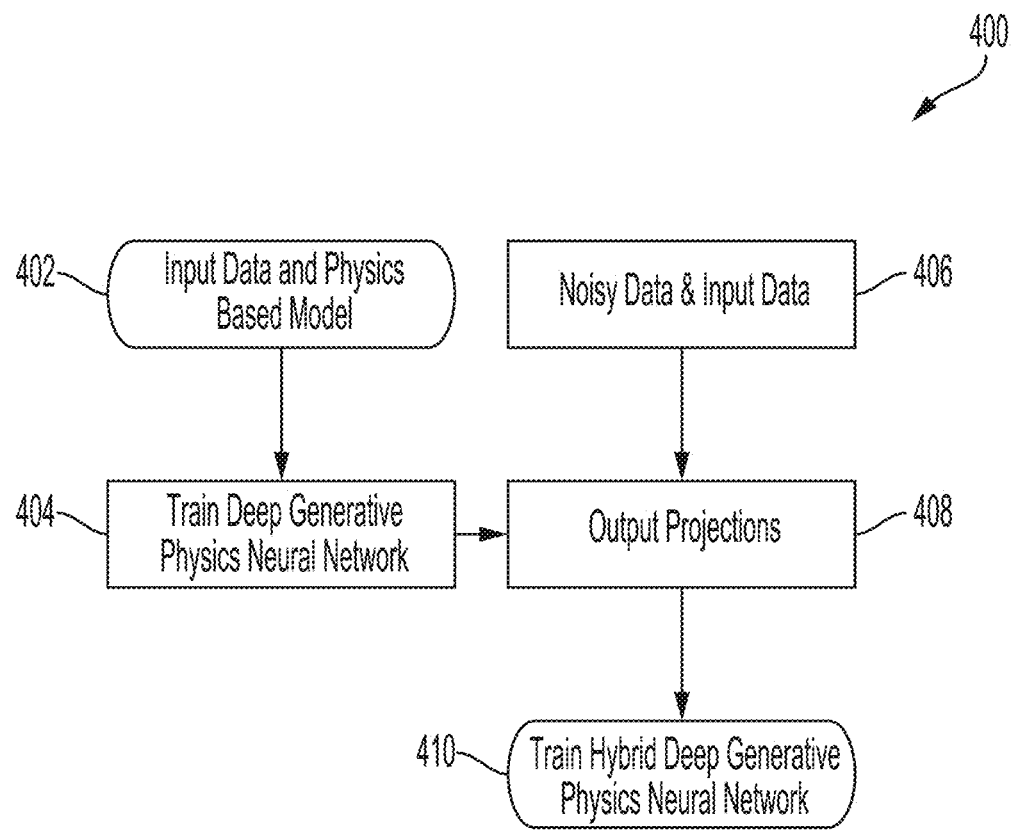
FIG. 4 is a flowchart of a process for training the hybrid deep generative physics neural network according to some aspects of the disclosure.

FIG. 4 is a flowchart of a process 400 for training the HDGPNN according to some aspects of the disclosure. At block 402 the processor 208 combines a set of input data and projections from a physics-based model, herein referred to as the input combination, in order to hybridize predictions. The input data can include information about the wellbore 104, the reservoir 110, or a combination thereof. Non-limiting examples of the input data can include temperature, pressure, permeability, porosity, or well location. The physics-based model can be any mathematical model relevant to the formation of, stimulation of, or production from the wellbore 104. Non-limiting examples of the physics-based model can include a simple diffusion model or a model based on Burger's Equation. When solved, the physics-based model may output information about physical attributes of the wellbore 104 or the reservoir 110 such as pressure, temperature, fluid flow, or any other physical attribute relevant to the formation of, stimulation of, or production from the wellbore 104.

At block 404, the processor 208 trains the DGPNN with the input combination determined in block 402. Training the DGPNN can include optimizing a set of projections of desired parameter weights, herein referred to as the projections, based on the input combination. The DGPNN may optimize the projections by iteratively computing a set of outputs with the input combination and determining the projections that best map the input combination to the outputs.

Block 406 includes taking measurements of noisy data and acquiring more input data, herein referred to as the second input data. Both the noisy data and the second input data can come from the wellbore 104 or the reservoir 110. Noisy data can include data measured from the wellbore 104 or the reservoir 110 that may be a result of electrical noise, may not represent physical attributes of the wellbore 104 or of the reservoir 110, or may be a statistical outlier. The second input data can include data measured from the wellbore 104 or the reservoir 110 that may not be noisy data.

At block 408, the processor 208 outputs projections from the DGPNN. As described with respect to block 404, the DGPNN can be trained with the input combination found in block 402 and the physics-based model in order to denoise, using a loss function based on mean squared error, the data acquired in block 406. The output of the DGPNN can be the projections, which can be a set of parameter weights. Non-limiting examples of the projections include pressure, temperature, permeability, porosity, or any combination thereof.

At block 410, the HDGPNN can be trained with a combination of the second input data and the noisy data acquired at block 406 and the projections of the DGPNN described with respect to block 408, herein referred to as the hybrid input. Training the HDGPNN can include optimizing a set of projections of desired controllable parameter weights, herein referred to as the controllable projections, based on the hybrid input. The HDGPNN may optimize the controllable projections by iteratively computing a set of outputs with the hybrid input and determining a set of hybrid projections that best map the hybrid input to the outputs.

An output of process 400, which can be the same or similar to the output of training the HDGPNN found in block 410, can include a set of controllable parameters. The controllable parameters can be input into the equipment 102 for causing formation of, stimulation of, or production from the wellbore 104.

Figure 5:
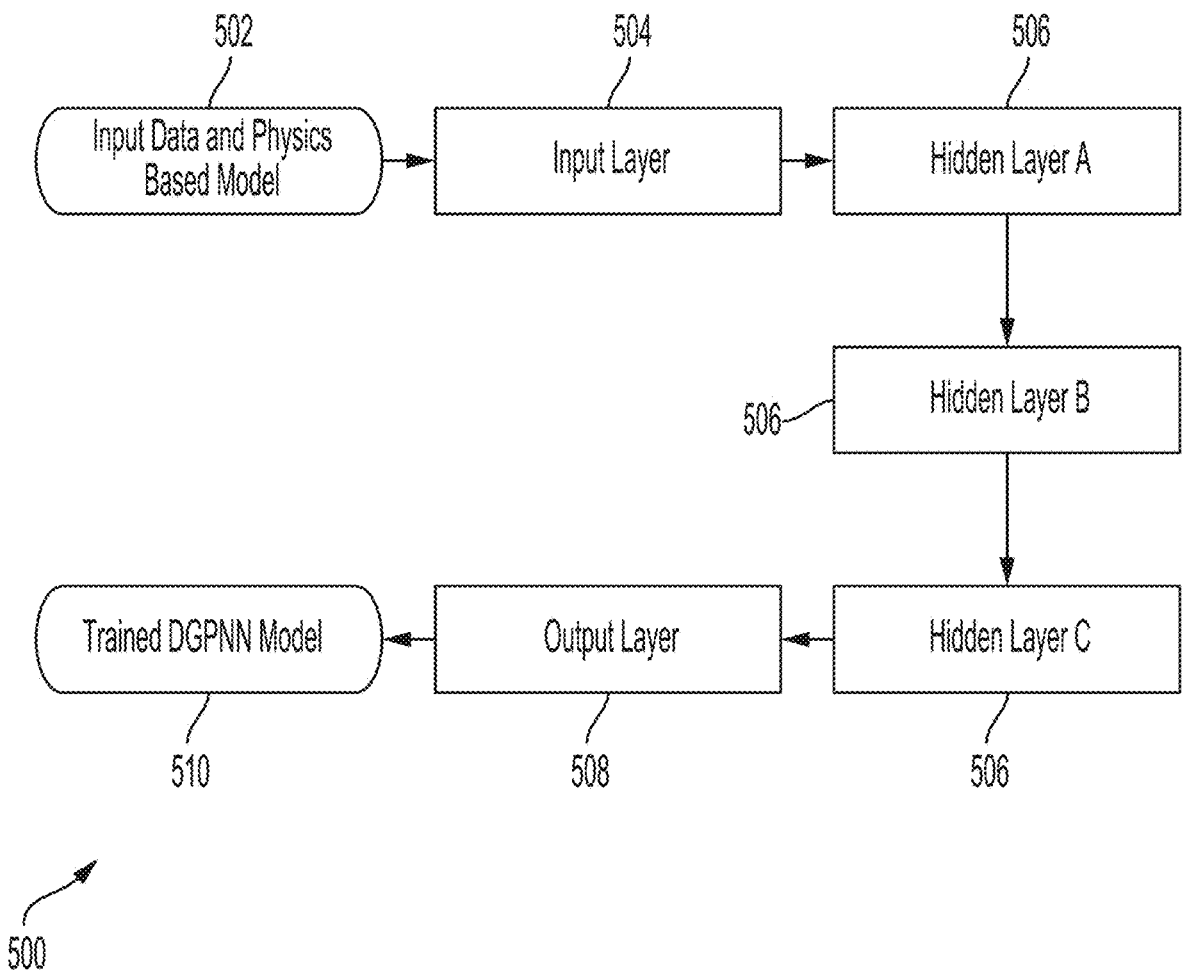
FIG. 5 is an architecture diagram illustrating a deep generative physics neural network model used for controlling wellbore equipment according to some aspects of the disclosure.

FIG. 5 is an architecture diagram 500 illustrating an example of the DGPNN that can be used for controlling wellbore equipment according to some aspects of the disclosure. Block 502 represents the input combination found in block 402 of process 400. The input combination includes a set of input data, which can include information about the wellbore 104, the reservoir 110, or a combination thereof. Non-limiting examples of the input data can include temperature, pressure, permeability, porosity, or well location. The input combination can also include information from a physics-based model, which can be any mathematical model relevant to the formation of, stimulation of, or production from the wellbore 104. Non-limiting examples of the physics-based model can include a simple diffusion model or a model based on Burger's Equation. When solved, the physics-based model may output information about physical attributes of the wellbore 104 or the reservoir 110 such as pressure, temperature, fluid flow, or any other physical attribute relevant to the formation of, stimulation of, or production from the wellbore 104.

The input layer 504 of the DGPNN can include a set of artificial input neurons. The artificial neurons can each be a perceptron, which is a mathematical model of a biological neuron. The input layer can provide the input to the DGPNN for further processing by a set of subsequent layers of the DGPNN.

Hidden layers 506 is an example include three hidden layers, A, B, and C, of the DGPNN. Other numbers of hidden layers are possible. The hidden layers can include a second set of artificial neurons, which can be the same as, or similar to, the artificial neurons found in the input layer 504. The hidden layers can be located between the input layer 504 and the output layer 508 of the DGPNN. The hidden layers can perform a set of non-linear transformations of the input combination. The non-linear transformations can involve applying weights to components of the input combination and running the input combination through an activation function, which can produce a set of outputs.

The output layer 508 can include a third set of artificial neurons, which can be the same as, or similar to, the artificial neurons found in the input layer 504. The output layer 508 can be a last layer of the DGPNN, and the output layer can return the set of outputs found in layers 506.

Block 510 represents the DGPNN in a trained state. The non-linear transformations executed by the hidden layers 506 may train the DGPNN, in which the DGPNN applies weights to the input combination. In the trained state, the DGPNN can output a set of projections that may represent physical measurements of the wellbore 104 or the reservoir 110 with a small amount of error. The projections can be used as an input for training the HDGPNN at block 410 of process 400.

Figure 6:
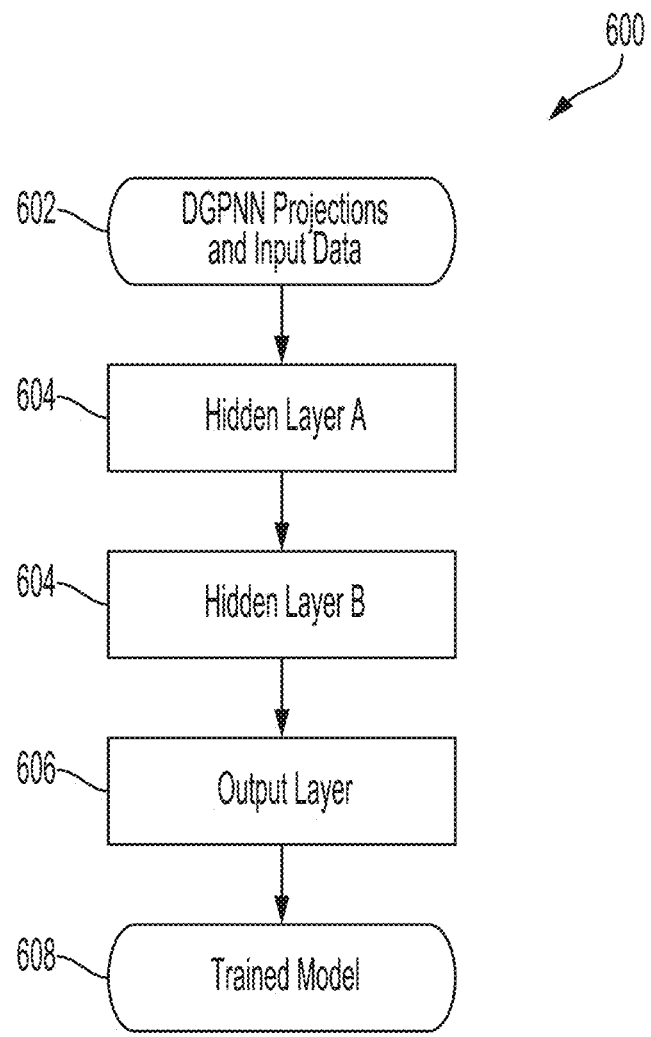
FIG. 6 is an architecture diagram illustrating a hybrid deep generative physics neural network model used for controlling wellbore equipment according to some aspects of the disclosure.

FIG. 6 is an architecture diagram 600 illustrating an HDGPNN that can be used for controlling wellbore equipment according to some aspects of the disclosure. Block 602 is the hybrid combination produced at block 410 of process 400. The hybrid input can include the projections from the DGPNN as described with respect to block 510 of the architecture diagram 500. The projections may represent physical measurements of the wellbore 104 or the reservoir 110, with non-limiting examples such as pressure or temperature. The hybrid combination can also include the second input data and the noisy data from block 406 of process 400. Both the second input data and the noisy data can come from the wellbore 104 or the reservoir 110. The second input data can include data measured from the wellbore 104 or the reservoir 110 that may not be noisy data and can include measurements of temperature, or pressure, of the wellbore 104 or permeability, or porosity, of the reservoir 110.

In this example, hidden layers 604 include two hidden layers, A, and B, but other numbers of hidden layers are possible. Hidden layers 604 can include a fourth set of artificial neurons, which can be the same as, or similar to, the artificial neurons found in the input layer 504 of the architecture diagram 500. Hidden layers 604 can be located between the hybrid input of block 602 and an output layer 606 of the HDGPNN. Hidden layers 604 can perform a second set of non-linear transformations of the hybrid input. The second non-linear transformations can include applying weights to components of the hybrid input and running the hybrid input through an activation function, which can produce a set of outputs.

Output layer 606 of the HDGPNN, can be referred to herein as the hybrid output layer. The hybrid output layer can include a fifth set of artificial neurons, which can be the same as, or similar to, the artificial neurons found in the input layer 504 of the architecture diagram 500. The hybrid output layer can be a last layer of the HDGPNN, and the hybrid output layer can return the set of outputs produced by layers 604.

Block 608 represents the HDGPNN in a trained state, herein referred to as the hybrid trained state. The non-linear transformations executed by the hidden layers 604 may train the HDGPNN, so that the HDGPNN applies weights to the hybrid input. In the hybrid trained state, the HDGPNN can output a set of projections that may include a set of parameters that can be used to control the equipment 102 for causing formation of, stimulation of, or production from the wellbore 104.

Figure 7:
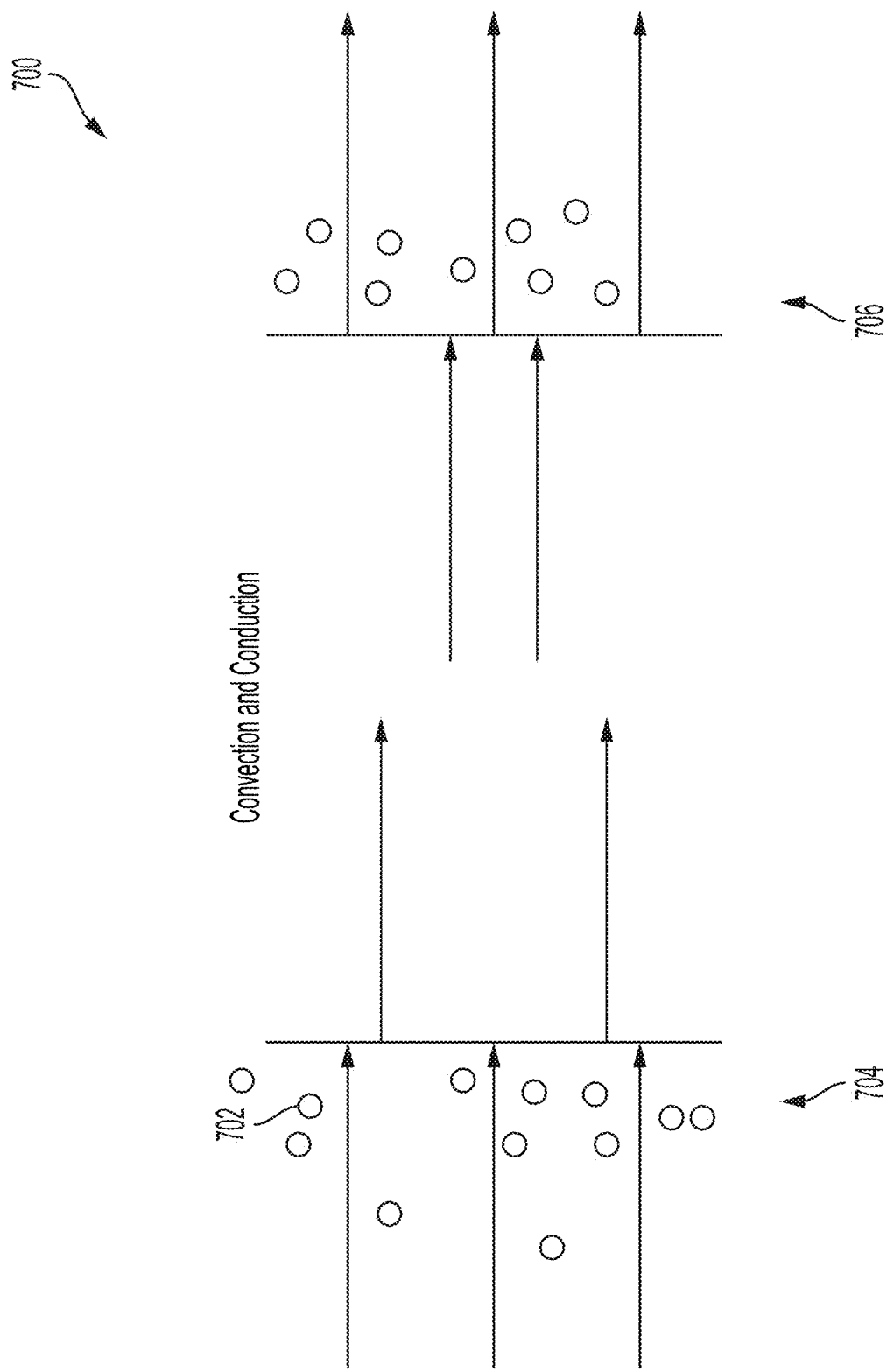
FIG. 7 is a heat diffusion diagram illustrating a steady diffusion model that can be used to project location-based temperature values for a reservoir according to some aspects of the present disclosure.

The system can be used to make projections by solving problems particular to producing oil and gas, such as those related to wellbore formation, wellbore stimulation, or wellbore production. For example, the system can be used to solve flow simulation problems related to hydrocarbon reservoirs using either a steady diffusion model or Burger's equation. FIG. 7 is a heat diffusion diagram 700 illustrating a steady diffusion model that can be used to project location-based temperature values for the reservoir 110 according to some aspects of the present disclosure. The steady diffusion model can be an example of the physics-based model which can be an input for the DGPNN. The diffusion diagram 700 includes a set of particles 702, which can represent hydrocarbon fluid, water, or any other type of particle that can be modeled with the steady diffusion model. An initial state 704 of the steady diffusion model depicts the particles 702 in mostly random positions. As time is allowed to progress in the steady diffusion model, the particles can spread in a manner that makes a distance between particles of a randomly chosen pair of particles 702 converge to an average distance between all particles 702 in the initial state 704 of the steady diffusion model. When the distance between the particles of a randomly chosen pair of particles 702 does converge on the average distance between all particles 702 in the initial state 704, an equilibrium state 706 can be reached.

Figure 8:
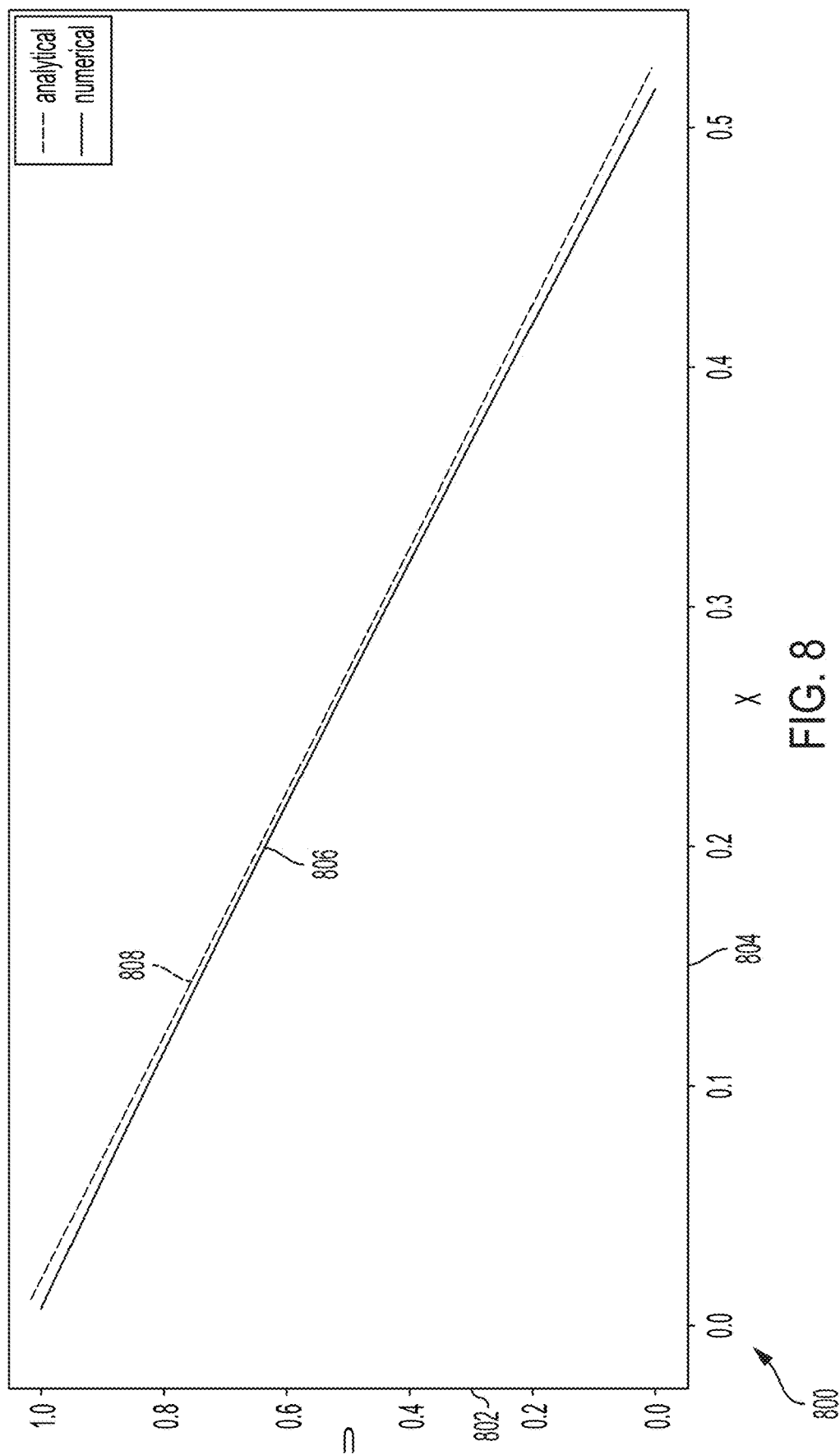
FIG. 8 is a graph illustrating a comparison between actual noisy signal data and data from projections of a diffusion model from a hybrid deep generative physics neural network according to some aspects of the present disclosure.

FIG. 8 is a graph 800 illustrating a comparison between an actual noisy signal data and projections of a diffusion model by the HDGPNN, herein referred to as the hybrid projections, according to some aspects of the present disclosure. An equation for the diffusion model can be expressed as:

$$U(x) = \frac{e^{(Pex)} - e^{Pe}}{1 - Pe - e^{Pe}}$$

where U is a dimensionless temperature, shown on a vertical axis 802 of the graph 800, Pe is a Peclet number, and x is a spatial location, shown on a horizontal axis 804 of the graph 800. A set of results can be seen on the graph 800, where solid line 806 corresponds to the data and dotted line 808 corresponds to the projections. As illustrated, the results are the actual noisy signal data and the hybrid projections plotted on a same set of axes: the vertical axis 802 and the horizontal axis 804. The results illustrated in FIG. 8 are nearly identical, which can mean the HDGPNN accurately projected a set of outputs of the diffusion model.

Figure 9:
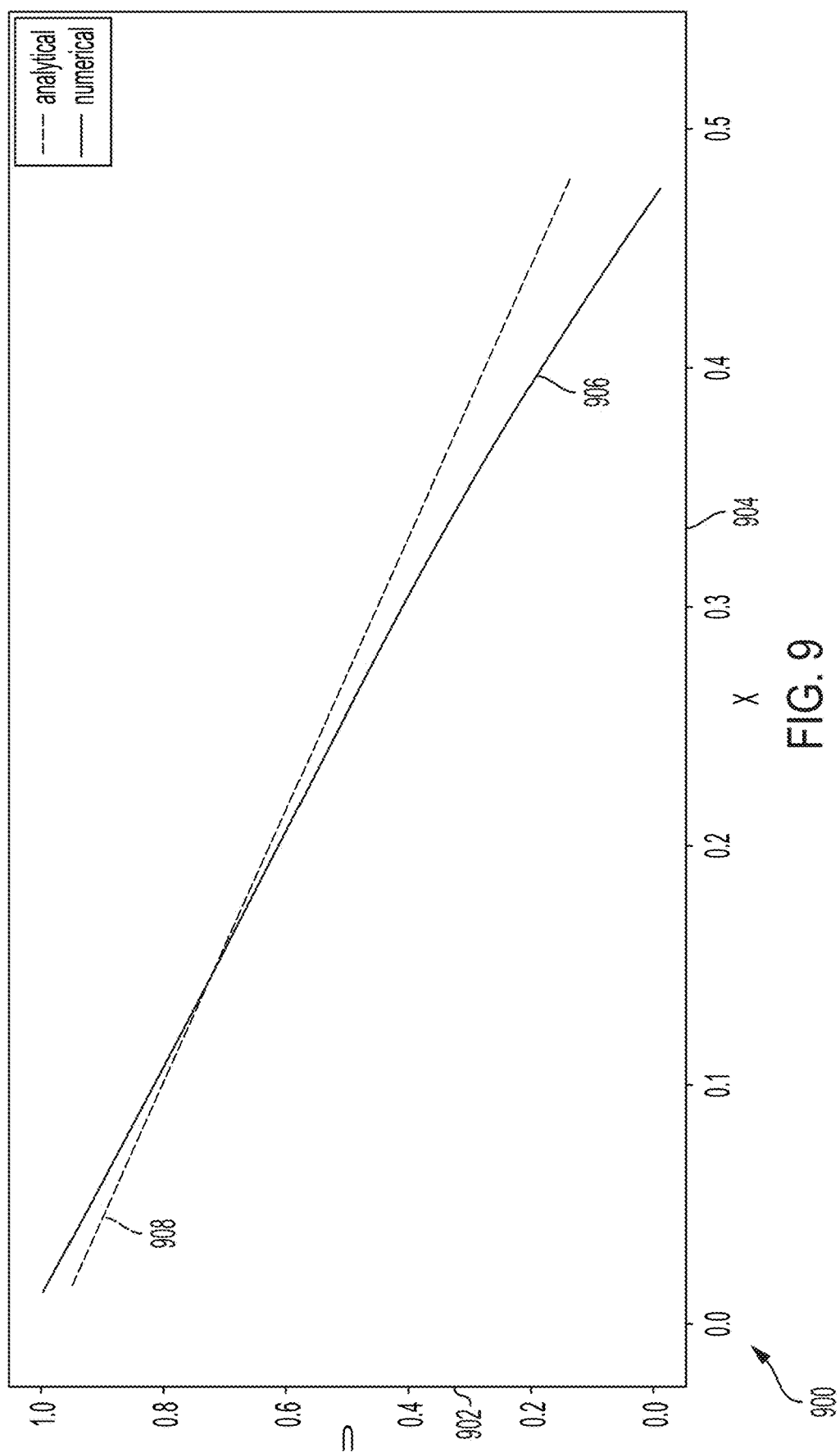
FIG. 9 is another graph illustrating a comparison between actual signal data and projections of the diffusion model from the deep generative physics neural network according to some aspects of the present disclosure.

FIG. 9 is a graph 900 illustrating a comparison between an actual signal data and a set of projections of the diffusion model from the DGPNN, herein referred to as the physics projections according to some aspects of the present disclosure. The equation of the diffusion model is the same as above, where U is a dimensionless temperature, shown on a vertical axis 902 of the second graph 900, Pe is the Peclet number, and x is a spatial location, shown on a horizontal axis 904 of the second graph 900. A second set of results can be seen on the graph 900, where solid line 906 corresponds to the data and dotted line 908 corresponds to the projections. As illustrated, the second results are the actual signal data and the physics projections plotted on a same set of axes: the vertical axis 902 and the horizontal axis 904. The second results as illustrated in FIG. 9 are similar but not identical, which suggests that the DGPNN used in the example of FIG. 9 can project a set of outputs of the diffusion model but not as accurately as the HDGPNN used in the example of FIG. 8.

Figure 10:
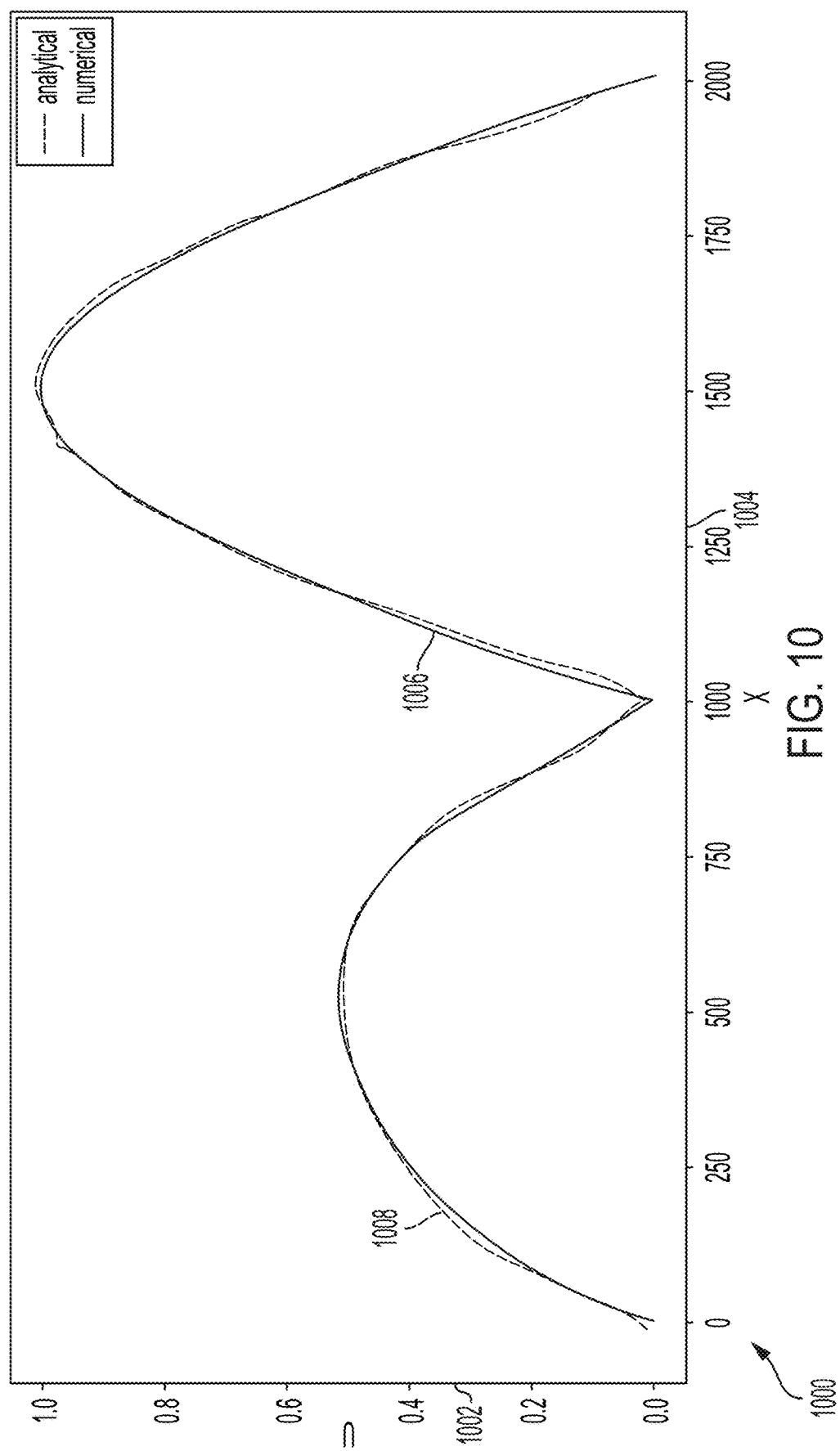
FIG. 10 is a graph illustrating a comparison between actual noisy signal data and data from projections of Burger's Equation from a hybrid deep generative physics neural network according to some aspects of the present disclosure.

FIG. 10 is a graph 1000 illustrating a comparison between an actual noisy signal data and data from projections of Burger's Equation from the HDGPNN, herein referred to as the second hybrid projections, according to some aspects of the present disclosure. Burger's Equation can be expressed as:

$$\frac{\partial u}{\partial t} - v \frac{\partial^2 u}{\partial x^2} + \frac{\partial u}{\partial x} = 0$$

where u is a velocity, shown on a vertical axis 1002, v is viscosity, t is time, and x is a spatial location, shown on a horizontal axis 1004. A third set of results can be seen on the graph 1000, where solid line 1006 corresponds to the data and dotted line 1008 corresponds to the projections. As illustrated, the third results are the actual noisy signal data and the second hybrid projections plotted on a same set of axes: the vertical axis 1002 and the horizontal axis 1004. The third results as illustrated are nearly identical, which can mean the HDGPNN used in the example of FIG. 10 accurately projected a set of outputs of Burger's Equation.

Figure 11:
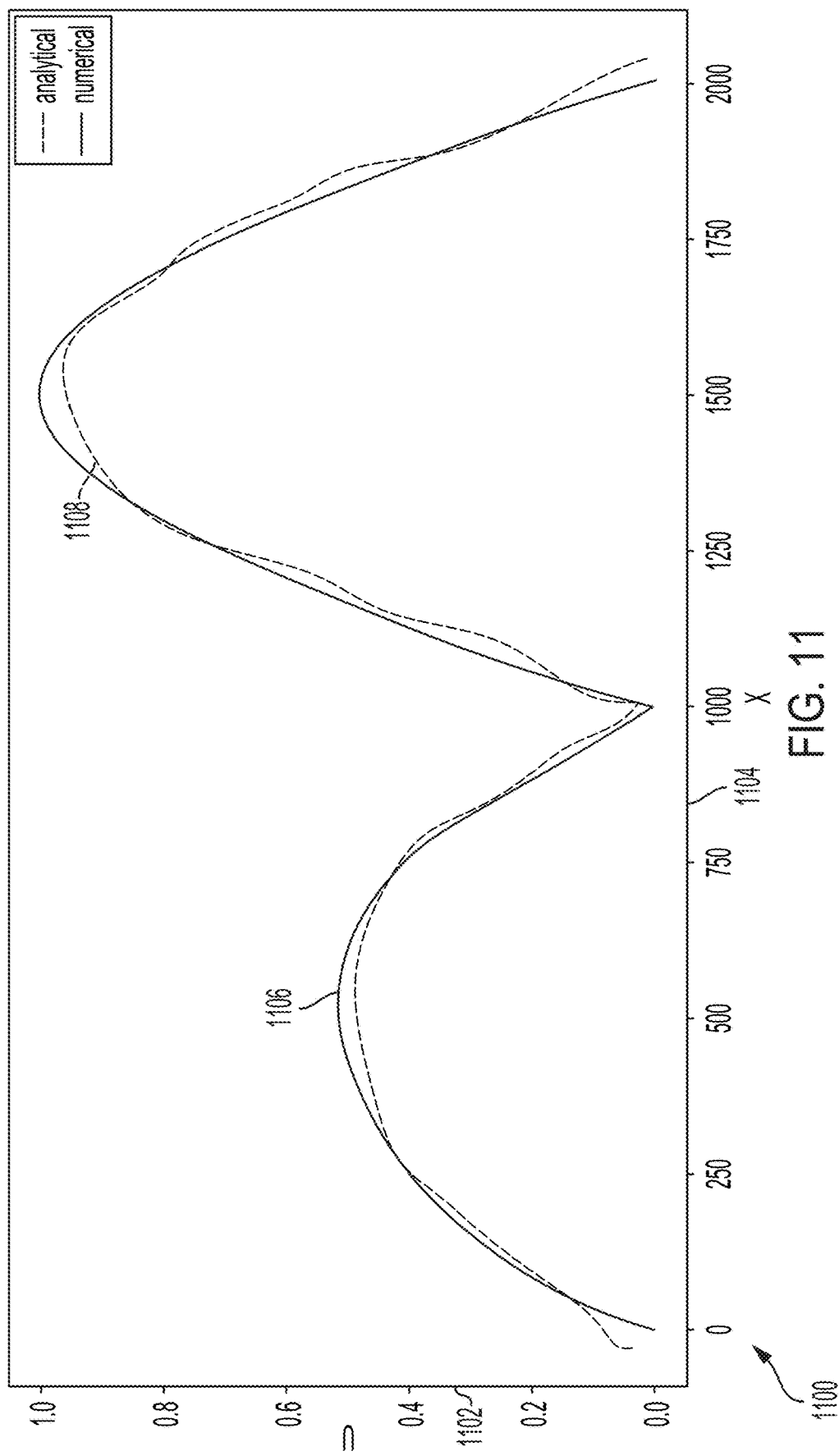
FIG. 11 is another graph illustrating a comparison between actual signal data and projections of Burger's Equation from the deep generative physics neural network according to some aspects of the present disclosure.

FIG. 11 is a graph 1100 illustrating a comparison between actual signal data and a set of projections of Burger's Equation from the DGPNN, herein referred to as the second physics projections according to some aspects of the present disclosure. Burger's Equation is expressed as same as above, where u is a velocity, shown on a vertical axis 1102, v is viscosity, t is time, and x is a spatial location, shown on a horizontal axis 1104. A fourth set of results can be seen on the graph 1100, where solid line 1106 corresponds to the data and dotted line 1108 corresponds to the projections. As illustrated, the fourth set of results is the actual signal data and the second physics projections plotted on a same set of axes: the vertical axis 1102 and the horizontal axis 1104. The data and projections in the fourth set of results as illustrated are similar but not identical, which suggests that the DGPNN used in the example of FIG. 11 can project a set of outputs of Burger's Equation but not as accurately as the HDGPNN.

In some aspects, a system for providing controlling equipment using a hybrid deep generative physics neural network is provided according to one or more of the following examples. As used below, any reference to a series of examples is to be understood as a reference to each of those examples disjunctively (e.g., "Examples 1-4" is to be understood as "Examples 1, 2, 3, or 4").

Example 1. A system includes a processor and a non-transitory memory device comprising instructions that are executable by the processor to cause the processor to perform operations. The operations include training a hybrid deep generative physics neural network (HDGPNN) using measured data from a hydrocarbon reservoir penetrable by a wellbore and using projections from a deep generative physics neural network (DGPNN), iteratively computing a plurality of projected values for wellbore variables using the HDGPNN, comparing the projected values to measured values, adjusting the projected values using the HDGPNN until the projected values match the measured values within a convergence criteria to produce an output value for at least one controllable parameter, and controlling equipment by applying the output value for the at least one controllable parameter, the equipment for at least one of formation of, stimulation of, or production from the wellbore.

Example 2. The system of example 1, wherein the DGPNN includes an operation to use a cost function based on a first principles physics model including boundary conditions.

Example 3. The system of example(s) 1-2, wherein the measured data and the projections include location-based temperature values for the hydrocarbon reservoir and the first principles physics model comprises a steady diffusion model.

Example 4. The system of example(s) 1-3, wherein the operations further include training the DGPNN by iteratively computing a set of outputs for an input combination.

Example 5. The system of example(s) 1-4 wherein the operations further include denoising the measured values using the DGPNN to hybridize the measured values and the projections using a loss function based on mean squared error.

Example 6. The system of example(s) 1-5, wherein the equipment includes a drilling tool and the at least one controllable parameter includes at least one of weight-on-bit, rate of penetration, or revolutions per minute of a drill bit, applied based on location or orientation of the drilling tool.

Example 7. The system of example(s) 1-6, wherein the DGPNN includes an operation to perform a nonlinear transformation of a hybrid input.

Example 8. A method includes training, by a processor, a hybrid deep generative physics neural network (HDGPNN) using measured data from a hydrocarbon reservoir penetrable by a wellbore and projections from a deep generative physics neural network (DGPNN), iteratively computing, by the processor, a plurality of projected values for wellbore variables using the HDGPNN, comparing, by the processor, the projected values to measured values, adjusting, by the processor, the projected values using the HDGPNN until the projected values match the measured values within a convergence criteria to produce an output value for at least one controllable parameter, and controlling equipment by the processor applying the output value for the at least one controllable parameter, the equipment for at least one of formation of, stimulation of, or production from the wellbore.

Example 9. The method of example 8, wherein the DGPNN uses a cost function based on a first principles physics model including boundary conditions.

Example 10. The method of example(s) 8-9, wherein the measured data and the projections include location-based temperature values for the hydrocarbon reservoir and the first principles physics model comprises a steady diffusion model.

Example 11. The method of example(s) 8-10 further includes denoising the measured values using the DGPNN to hybridize the measured values and the projections using a loss function based on mean squared error.

Example 12. The method of example(s) 8-11, wherein the equipment includes a drilling tool and the at least one controllable parameter includes at least one of weight-on-bit, rate of penetration, or revolutions per minute of a drill bit, applied based on location or orientation of the drilling tool.

Example 13. The method of example(s) 8-12, wherein the DGPNN performs a nonlinear transformation of a hybrid input.

Example 14. A non-transitory computer-readable medium includes instructions that are executable by a processor for causing the processor to perform operations related to controlling equipment for at least one of formation of, stimulation of, or production from a wellbore. The operations include training a hybrid deep generative physics neural network (HDGPNN) using measured data from a hydrocarbon reservoir penetrable by the wellbore and projections from a deep generative physics neural network (DGPNN), iteratively computing a plurality of projected values for wellbore variables using the HDGPNN, comparing the projected values to measured values, adjusting the projected values using the HDGPNN until the projected values match the measured values within a convergence criteria to produce an output value for at least one controllable parameter, and controlling the equipment by applying the output value for the at least one controllable parameter.

Example 15. The non-transitory computer-readable medium of example 14, wherein the DGPNN includes an operation to use a cost function based on a first principles physics model including boundary conditions.

Example 16. The non-transitory computer-readable medium of example(s) 14-15, wherein the measured data and the projections include location-based temperature values for the hydrocarbon reservoir and the first principles physics model comprises a steady diffusion model.

Example 17. The non-transitory computer readable medium of example(s) 14-16, wherein the operations further include training the DGPNN by iteratively computing a set of outputs for an input combination.

Example 18. The non-transitory computer-readable medium of example(s) 14-17, wherein the operations further include denoising the measured values using the DGPNN to hybridize the measured values and the projections using a loss function based on mean squared error.

Example 19. The non-transitory computer-readable medium of example(s) 14-18, wherein the equipment includes a drilling tool and the at least one controllable parameter includes at least one of weight-on-bit, rate of penetration, or revolutions per minute of a drill bit, applied based on location or orientation of the drilling tool.

Example 20. The non-transitory computer-readable medium of example(s) 14-19, wherein the DGPNN includes an operation to perform a nonlinear transformations of a hybrid input.

The foregoing description of the examples, including illustrated examples, has been presented only for the purpose of illustration and description and is not intended to be exhaustive or to limit the subject matter to the precise forms disclosed. Numerous modifications, combinations, adaptations, uses, and installations thereof can be apparent to those skilled in the art without departing from the scope of this disclosure. The illustrative examples described above are given to introduce the reader to the general subject matter discussed here and are not intended to limit the scope of the disclosed concepts.

What is claimed is:

1. A system comprising:
a processor; and
a non-transitory memory device comprising instructions that are executable by the processor to cause the processor to perform operations comprising:
training a hybrid deep generative physics neural network (HDGPNN) using measured data from a hydrocarbon reservoir penetrable by a wellbore and using projections from a deep generative physics neural network (DGPNN);
iteratively computing a plurality of projected values for wellbore variables using the HDGPNN;
comparing the projected values to measured values;
adjusting the projected values using the HDGPNN until the projected values match the measured values within a convergence criteria to produce an output value for at least one controllable parameter; and
controlling equipment by applying the output value for the at least one controllable parameter, the equipment for at least one of formation of, stimulation of, and production from the wellbore.

2. The system of claim 1, wherein the DGPNN includes an operation to use a cost function based on a first principles physics model including boundary conditions.

3. The system of claim 2, wherein the measured data and the projections include location-based temperature values for the hydrocarbon reservoir and the first principles physics model comprises a steady diffusion model.

4. The system of claim 1, wherein the operations further comprise training the DGPNN by iteratively computing a set of outputs for an input combination.

5. The system of claim 1, wherein the operations further comprise denoising the measured values using the DGPNN to hybridize the measured values and the projections using a loss function based on mean squared error.

6. The system of claim 5, wherein the equipment includes a drilling tool and the at least one controllable parameter comprises at least one of weight-on-bit, rate of penetration, or revolutions per minute of a drill bit, applied based on location or orientation of the drilling tool.

7. The system of claim 1, wherein the DGPNN includes an operation to perform a nonlinear transformation of a hybrid input.

8. A method comprising:
training, by a processor, a hybrid deep generative physics neural network (HDGPNN) using measured data from a hydrocarbon reservoir penetrable by a wellbore and projections from a deep generative physics neural network (DGPNN);
iteratively computing, by the processor, a plurality of projected values for wellbore variables using the HDGPNN;
comparing, by the processor, the projected values to measured values;
adjusting, by the processor, the projected values using the HDGPNN until the projected values match the measured values within a convergence criteria to produce an output value for at least one controllable parameter; and
controlling equipment by the processor applying the output value for the at least one controllable parameter, the equipment for at least one of formation of, stimulation of, and production from the wellbore.

9. The method of claim 8, wherein the DGPNN uses a cost function based on a first principles physics model including boundary conditions.

10. The method of claim 9, wherein the measured data and the projections include location-based temperature values for the hydrocarbon reservoir and the first principles physics model comprises a steady diffusion model.

11. The method of claim 8, further comprising denoising the measured values using the DGPNN to hybridize the measured values and the projections using a loss function based on mean squared error.

12. The method of claim 11, wherein the equipment includes a drilling tool and the at least one controllable parameter comprises at least one of weight-on-bit, rate of penetration, or revolutions per minute of a drill bit, applied based on location or orientation of the drilling tool.

13. The method of claim 8, wherein the DGPNN performs a nonlinear transformation of a hybrid input.

14. A non-transitory computer-readable medium that includes instructions that are executable by a processor for causing the processor to perform operations related to controlling equipment for at least one of formation of, stimulation of, and production from a wellbore, the operations comprising:
training a hybrid deep generative physics neural network (HDGPNN) using measured data from a hydrocarbon reservoir penetrable by the wellbore and projections from a deep generative physics neural network (DGPNN);
iteratively computing a plurality of projected values for wellbore variables using the HDGPNN;
comparing the projected values to measured values;
adjusting the projected values using the HDGPNN until the projected values match the measured values within a convergence criteria to produce an output value for at least one controllable parameter; and
controlling the equipment by applying the output value for the at least one controllable parameter.

15. The non-transitory computer-readable medium of claim 14, wherein the DGPNN includes an operation to use a cost function based on a first principles physics model including boundary conditions.

16. The non-transitory computer-readable medium of claim 15, wherein the measured data and the projections include location-based temperature values for the hydrocarbon reservoir and the first principles physics model comprises a steady diffusion model.

17. The non-transitory computer-readable medium of claim 14, wherein the operations further comprise training the DGPNN by iteratively computing a set of outputs for an input combination.

18. The non-transitory computer-readable medium of claim 14, wherein the operations further comprise denoising the measured values using the DGPNN to hybridize the measured values and the projections using a loss function based on mean squared error.

19. The non-transitory computer-readable medium of claim 18, wherein the equipment includes a drilling tool and the at least one controllable parameter comprises at least one of weight-on-bit, rate of penetration, or revolutions per minute of a drill bit, applied based on location or orientation of the drilling tool.

20. The non-transitory computer-readable medium of claim 14, wherein the DGPNN includes an operation to perform a nonlinear transformations of a hybrid input.

* * * * *